(12) United States Patent
Michler

(10) Patent No.: US 7,030,407 B2
(45) Date of Patent: Apr. 18, 2006

(54) PHOTON EMITTER AND DATA TRANSMISSION DEVICE

(75) Inventor: Peter Michler, Kornwestheim (DE)

(73) Assignee: Infineon Technologies AG, Munich (DE)

( * ) Notice: Subject to any disclaimer, the term of this patent is extended or adjusted under 35 U.S.C. 154(b) by 109 days.

(21) Appl. No.: 10/742,601

(22) Filed: Dec. 19, 2003

(65) Prior Publication Data

US 2004/0149982 A1  Aug. 5, 2004

Related U.S. Application Data

(63) Continuation of application No. PCT/DE02/01895, filed on May 23, 2002.

(30) Foreign Application Priority Data

Jun. 20, 2001 (DE) ............... 101 29 587
Jul. 17, 2001 (DE) ............... 101 34 825

(51) Int. Cl.
  *H01L 33/00* (2006.01)
(52) U.S. Cl. ............... 257/13; 257/85; 372/45
(58) Field of Classification Search ........ 257/13, 257/85; 372/45
  See application file for complete search history.

(56) References Cited

U.S. PATENT DOCUMENTS 5,289,018 A  2/1994  Okuda et al.
5,953,356 A  9/1999  Botez et al.
6,864,501 B1 *  3/2005  Shields et al. ......... 257/13
2001/0016095 A1 *  8/2001  Tomita ............... 385/15

FOREIGN PATENT DOCUMENTS

DE  199 47 853 A1  4/2000
EP  0 892 474 A1  1/1999
EP  1 037 341 A2  9/2000
JP  10-209572 A1  8/1998

OTHER PUBLICATIONS

Santori et al, "Triggered . . . Dot" Physical Review Letters vol. 86 No. 8 pp. 1502-1505, Feb. 19, 2001.*
Ribbat Ch et al.; "High Power Quantum Dot Lasers at 1140 nm"; Conference Digest, 2000 IEEE 17th International Semiconductor Laser Conference (Cat. No. 00CH37092), Monterey, CA. USA, Sep. 25-28, 2000, pp. 131-132.
D. Litvinov et al; "Growth and vertical correlation of CdSe/ZnSe quantum dots"; Journal of Applied Physics, Apr. 1, 2000, AIP, USA, vol. 89, No. 7, pp. 3695-3699.

(Continued)

*Primary Examiner*—Jerome Jackson
(74) *Attorney, Agent, or Firm*—Darby & Darby

(57) ABSTRACT

Photon emitter and data transmission device wherein a second resonator is arranged in a direction of emission of a radiation-emitting first resonator in such a way that a quantum dot contained in the second resonator can be excited by energy of radiation emitted by the first resonator. A control unit brings the excitation ground state of the quantum dot into resonance with a prescribed resonator mode of the second resonator.

20 Claims, 3 Drawing Sheets

OTHER PUBLICATIONS

J. Kim et al.: "A Single-Photon Turnstile Device"; Letters to Nature, vol. 397, Feb. 11, 1999, pp. 500-503.

J.M. Gerard et al.;"Strong Purcell Effect for InAs Quantum Boxes in Three-Dimensional Solid-State Microcavities"; IEEE Journal of Lightwave Technology, vol. 17, No. 11, Nov. 1999, pp. 2089-2095.

P. Michler et al; "A Quantum Dot Single-Photon Turnstile Device"; Science, vol. 290, Dec. 2000, pp. 2282-2285.

J.M. Gerard et al.;"Enhanced Spontaneous Emission by Quantum Boxes in a Monolithic Optical Microcavity"; Physical Review Letters, vol. 81, No. 5, Aug. 1998, pp. 1110-1113.

J.A. Lott et al.; "InAs-InGaAs quantum dot VCSELs on GaAs substrates emitting at 1.3um"; Electronics Letters, vol. 36, No. 16, Aug. 3, 2000, pp. 1384-1385.

* cited by examiner

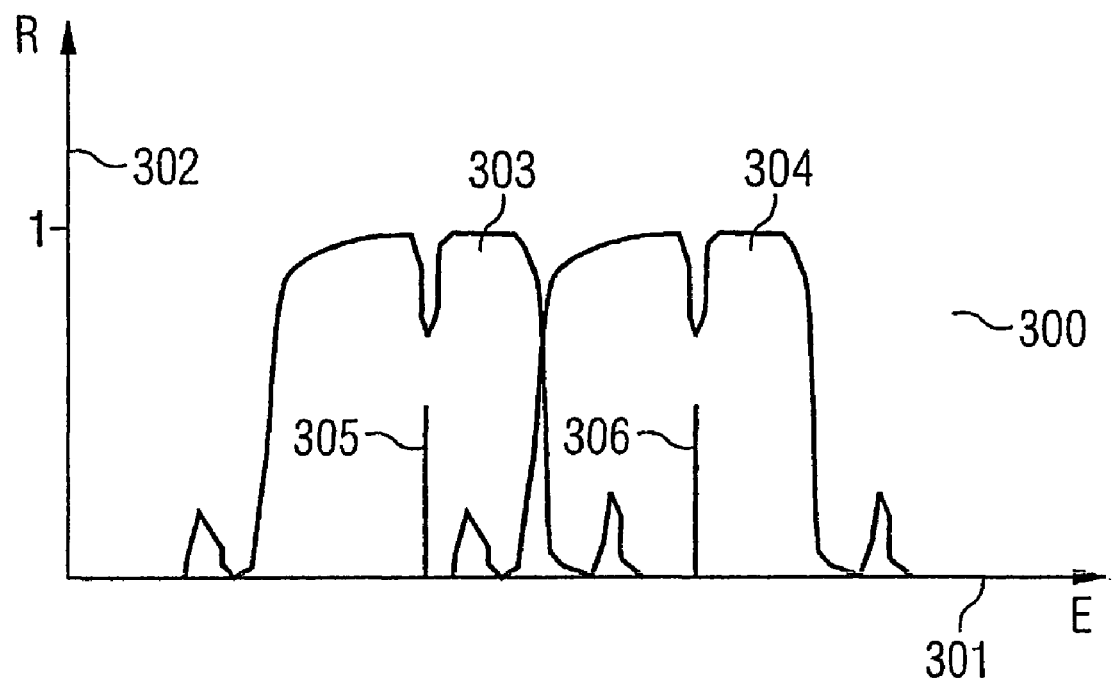

PHOTON EMITTER AND DATA TRANSMISSION DEVICE

CROSS-REFERENCE TO RELATED APPLICATIONS

This application is a continuation of International Patent Application Serial No. PCT/DE02/01895, filed May 23, 2002, which published in German on Jan. 3, 2003 as WO 03/001636 A1.

FIELD OF THE INVENTION

The present invention relates to a photon emitter and a data transmission device with a photon emitter, which is suitable to emit single photons on demand at relatively high temperatures.

BACKGROUND OF THE INVENTION

Such a photon emitter is known from J. Kim et al., "A Single Photon-Turnstile Device, Letters to Nature," Vol. 397, pages 500–503, February 1999.

In the case of this component known from J. Kim et al., it was described that individual photons with a frequency of 10 MHz can be emitted at an operating temperature of 50 mK. The photon emitter in accordance with J. Kim et al. is a component which has a mesoscopic double barrier pn heterojunction with a quantum film as active layer for emitting the photons. This photon emitter is based on the principle of a coulomb blockade for electrons and holes. The coulomb blockade prevents more than one electron from being able to tunnel into the active quantum film. In the photon emitter in accordance with J. Kim et al., the charge energy of a single electron must be greater than the thermal background energy. For this reason, the applicability of this known component is limited to very low temperatures in the range of mK.

It is known, furthermore, from J. M. Gerard and B. Gayral, "Strong Purcell Effect for InAs Quantum Boxes in a Three-Dimensional Solid-State Microcavity," IEEE Journal of Lightwave Technology, Vol. 17, No. 11, pages 2089–2095, November 1999, that a quantum dot located in a semiconductor can be used in a resonator to generate single photons.

It is demonstrated experimentally in P. Michler et al., "A Quantum Dot Single-Photon Turnstile-Device," Science, Vol. 290, pages 2282–2285, December 2000, that this is also possible in the case of non-resonant, optical pumping of the quantum dot, or in other words by exciting the quantum dot by optical pumping in the barrier.

It is to be pointed out in this connection that the excitation ground state of a quantum dot, which is produced by self-organized growth, can be predicted only within the inhomogeneous line width of the quantum-dot array. For this reason, the excitation ground state energy of a quantum dot and the energy of the resonator mode of a resonator correspond only randomly, and not in a fashion which can be predicted deterministically.

For this reason, the photon emitters in J. M. Gerard and B. Gayral, or P. Michler et al. are not suitable for application on a massive scale.

A vertical long-wave laser resonator with an integrated short-wave pumping laser is described in DE 199 47 853 A1 and EP 1 037 341 A2 in each case. The excited emission from the short-wave laser has the effect of activating the long-wave laser. An optically transparent adhesive fastens the lasers in vertical alignment.

Furthermore, a light-emitting semiconductor element with a quantum-dot region is disclosed in Patent Abstracts of Japan 10209572a or in A. Lott et al., "InAs—InGaAs quantum dot VCSELs on GaAs substrates emitting at 1.3 μm," Electronics Letters, Vol. 36, No. 16, pages 1384–1385, August 2000.

BRIEF SUMMARY OF THE INVENTION

The invention is thus based on the problem of specifying a photon emitter and a data transmission device with a photon emitter, which is suitable to emit single photons on demand at relatively high temperatures.

The problem is solved by means of the photon emitter having the features in accordance with the independent patent claim.

A photon emitter has a radiation-emitting first resonator, and a second resonator, which contains at least one quantum dot. The second resonator is arranged in the direction of emission of the radiation emitted by the first resonator in such a way that the quantum dot in the second resonator can be excited by the energy of the emitted radiation. Furthermore, the photon emitter has a control unit which is coupled to the second resonator and which is set up in such a way that the excitation ground state of the quantum dot in the second resonator can be set in such a way that it can be brought into resonance with a prescribed resonator mode of the second resonator.

The setting is preferably performed by using an electric field which is applied by means of the control unit to the second resonator and thus to the quantum dot or a plurality of quantum dots in the second resonator.

In concrete terms, the displacement of the excitation ground state is based on the so called "Quantum Confined Stark Effect" (QCSE), which consists in concrete terms in that the ground energy of a quantum dot can be varied by applying an electric field.

The invention can be seen in concrete terms in a single-photon emitter which has two resonators, one resonator being configured as an optical pump for the second resonator. Quantum dots present in the second resonator can be excited by means of optical pumping of the radiation emitted by the first resonator, such that single photons are emitted by the second resonator.

If exactly one quantum dot over the multiplicity of quantum dots present in the second resonator is brought to resonance with the second resonator, that is to say if the excitation ground state of exactly one quantum dot is set in the second resonator in such a way that it is in resonance with the second resonator, exactly one photon is emitted by the photon emitter per electric excitation pulse, that is to say in this case the photon emitter constitutes a single-photon emitter which can be used very advantageously in reliable data transmission, in particular.

Preferred developments of the invention are following from the dependent claims.

In accordance with one refinement of the invention, the first resonator is a vertically emitting laser element.

If the first resonator is a vertically emitting laser element, the result for the photon emitter is a component as photon emitter which is extremely compact and can be produced very cost-effectively with the aid of standard processes.

In accordance with the one refinement of the invention, the control unit is set up in such a way that the excitation ground state of the active quantum dot in the second resonator can be set by means of applying an electric field.

The first resonator and/or the second resonator can be configured as DBR (Distributed Bragg Resonator) resonators.

A very simple and compact photon emitter is specified by this development of the invention.

In accordance with a further refinement of the invention, the first resonator and/or the second resonator is/are produced as resonators from aluminium gallium arsenide.

The first resonator can have a first reflector layer, a first confinement layer applied to the first reflector layer, an active layer applied to the first confinement layer, a second confinement layer applied to the active layer, and a second reflector layer applied to the second confinement layer.

The first reflector layer, the first confinement layer, the second confinement layer and the second reflector layer can be produced from aluminium gallium arsenide.

The active layer can contain gallium arsenide.

Alternatively, ternary semiconductor compounds made from zinc cadmium selenide, indium gallium nitride, and indium gallium phosphide can be used for the active layer.

When zinc cadmium selenide is used as active layer, use may be made of zinc selenide or a quaternary semiconductor compound made from magnesium zinc sulphur selene, aluminium gallium nitride can be used with an indium gallium nitride as active layer, and a quaternary semiconductor compound made from aluminium gallium indium phosphor can be used with an indium gallium phosphide as active layer, as reflector layer in each case.

In general, any desired and suitable semiconductor structure can be used which has an appropriate energy band characteristic suitable for a photon emitter.

In particular, any desired semiconductor element, preferably any suitable III–V semiconductor heterostructure or II–VI semiconductor heterostructure can be used.

The second resonator can have a third reflector layer, a third confinement layer applied to the third reflector layer, a quantum-dot layer, applied to the third confinement layer, with the at least one quantum dot, preferably with a plurality of quantum dots, a fourth confinement layer applied to the quantum-dot layer, and a fourth reflector layer applied to the fourth confinement layer.

The third reflector layer, the third confinement layer, the fourth confinement layer and the fourth reflector layer can contain aluminium gallium arsenide, alternatively the same materials as the first reflector layer, the first confinement layer, the second confinement layer and the second reflector layer of the first resonator.

In accordance with this refinement of the invention, the quantum-dot layer can contain indium arsenide or indium gallium arsenide.

Alternatively, the quantum-dot layer can have cadmium selenide or zinc cadmium selenide for the case in which the reflector layers and the confinement layers of the second resonator contain zinc selenide and/or zinc sulphide selenide and/or zinc magnesium sulphide selenide.

If the reflector layers and the confinement layers of the second resonator are fabricated from aluminium gallium indium phosphide, the quantum-dot layer preferably has indium phosphide or indium gallium phosphide.

If the reflector layers and the confinement layers of the second resonator are fabricated from aluminium gallium nitride, the quantum-dot layer preferably has gallium nitride or indium gallium nitride.

In accordance with a further refinement of the invention, a tunnel barrier layer is provided between the third reflector layer and the quantum-dot layer and/or between the quantum-dot layer and the fourth reflector layer, in order to prevent tunnelling of the charge carriers from the quantum dots into the confinement layers.

The efficiency of the photon emitter is further increased by means of this refinement of the invention.

In accordance with a further refinement of the invention, at least one optical wing mirror is fitted on at least one side wall of the second resonator, preferably around the entire circumference of the second resonator. The entire circumference of the second resonator is preferably provided with optical wing mirrors in order further to increase the efficiency of the photon emitter.

The photon emitter can be used very advantageously in the field of data communication, in particular in the field of tap-proof data communication, which is gaining very substantial significance in the field of global digital communication networks, in particular in the field of the Internet.

BRIEF DESCRIPTION OF THE DRAWINGS

Exemplary embodiments of the invention are illustrated in the figures and explained in more detail below. In the drawings:

FIG. 3 shows a diagram in which the tuning of the excitation ground state of a quantum dot in the second resonator with the prescribed resonator mode is illustrated. Furthermore, the resonator mode of the first resonator, or the energy position relative to the second resonator is illustrated.

DETAILED DESCRIPTION OF THE PREFERRED MODE OF THE INVENTION

Figure 1:
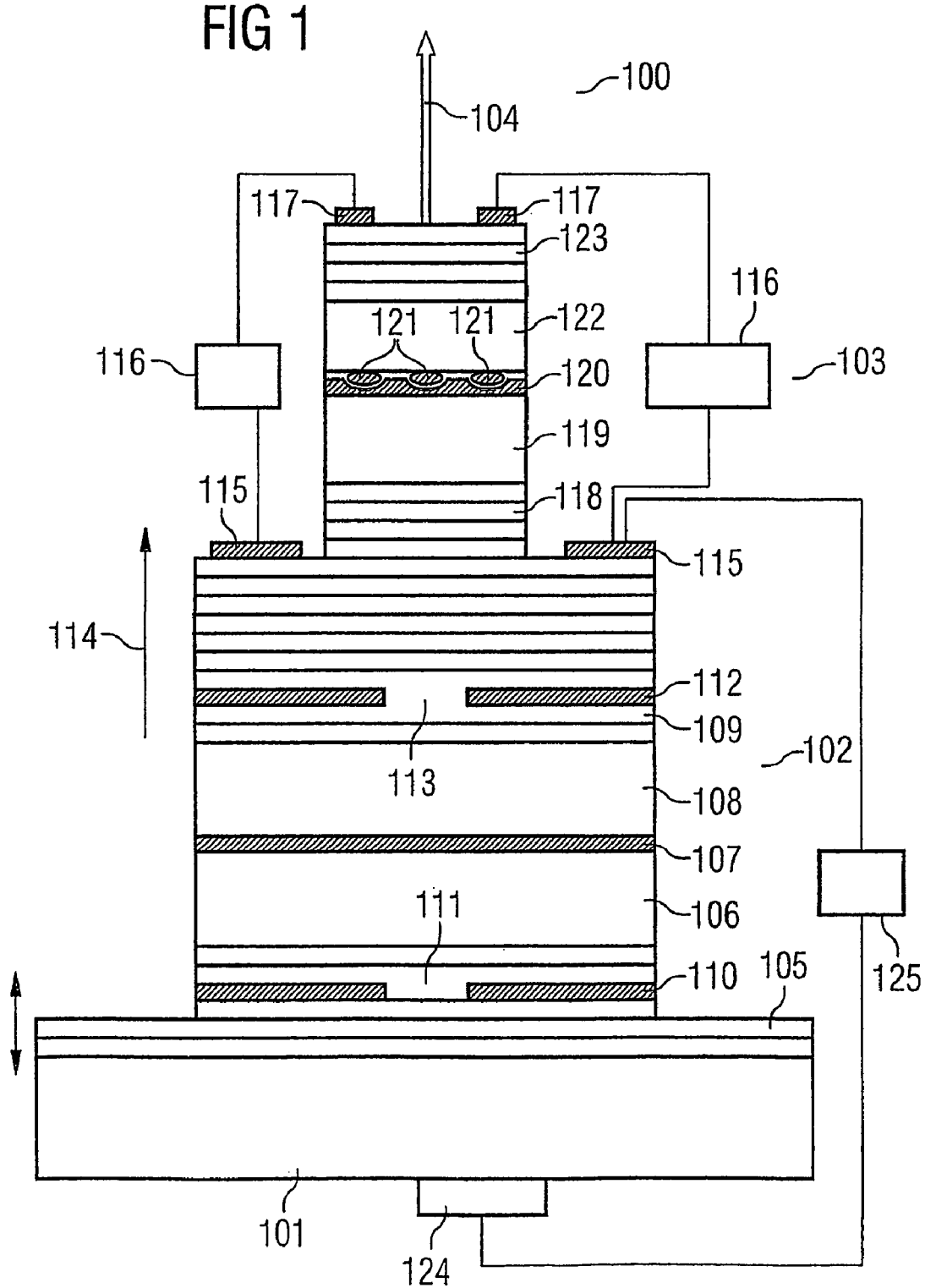
FIG. 1 shows a cross-sectional view of a photon emitter in accordance with a first exemplary embodiment of the invention.

FIG. 1 shows a cross-sectional view of a photon emitter 100 in accordance with a first exemplary embodiment of the invention.

A first resonator 102 whose structure will be explained in more detail below is applied to a substrate 101 made from gallium arsenide with a thickness of up to half a millimeter, fundamentally of arbitrary thickness.

A second resonator 103, which is likewise explained in more detail below, is applied to the first resonator, which is configured as a vertically emitting laser element, this being done in such a way that individual photons can emit in a direction of emission symbolized by an arrow 104.

The first resonator 102 has as vertically emitting laser element a first reflector layer, configured as a Bragg reflector of a thickness between from one to two µm, as a function of the wavelength of the light beam to be emitted by the laser element, generally with a layer thickness of an individual layer of the Bragg reflector of a quarter of the wavelength of the light beam to be emitted.

The first reflector layer 105, configured as a DBR reflector, is fabricated from the following material combination: 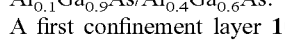
$Al_{0.1}Ga_{0.9}As/Al_{0.4}Ga_{0.6}As$.

A first confinement layer 106 made from $Al_{0.1}Ga_{0.9}As$ with a thickness of approximately 100 nm is applied to the first reflector layer 105. In general, the sum of the thicknesses of the confinement layers and the active layer corresponds to a wavelength or a multiple of the wavelength of the emitted light.

An active layer 107 with a thickness of 10 to 20 nm, once again generally dependent on the wavelength λ of the light beam emitted by the first resonator 102 is grown on the first confinement layer 106 in such a way that it holds that:

$$h \times v < E_g(Al_{0.1}Ga_{0.9}As),$$

wherein h denotes Planck's constant, v denotes the frequency of the light beam emitted by the first resonator 102, and $E_g$ denotes the energy gap between the valence band and the conduction band of the material of the active layer 107.

A second confinement layer 108, likewise of a thickness of 100 nm, is grown on the active layer 107, the second confinement layer 108 being fabricated from the same material as the first confinement layer 106, that is to say from $Al_{0.1}Ga_{0.9}As$ in accordance with this first exemplary embodiment.

A second reflector layer 109, likewise configured as a DBR reflector layer, is grown, in turn, on the second confinement layer 108 to a thickness of 1 to 2 µm and is made from the same material as the first reflector layer 105, that is to say from $Al_{0.1}Ga_{0.9}As/Al_{0.4}Ga_{0.6}As$ in accordance with this exemplary embodiment.

Furthermore, a first diaphragm 110 is inserted with an aperture 111 of a width between from one to three µm in the first reflector layer 105. A second diaphragm 112, likewise with an aperture of a width 113 of between one and three lm is likewise inserted in the second reflector layer 109.

The diaphragms 110, 112 serve for the purpose of constricting current. The direction of emission of the light beam emitted by the first resonator 102 is symbolized in FIG. 1 by a further arrow 114.

The first resonator 102 is fabricated using conventional semiconductor process steps.

Applied to the second reflector layer 109 is a first electric contact 115 to which a control unit 116 is connected for applying an electric field between the first electric contact 115 and a second electric contact 117, described below.

A second resonator 103, whose structure is explained in more detail below, is grown on the first resonator 102.

A third reflector layer 118 of the second resonator 103 is grown directly on the second reflector layer 109 of the first resonator 102, the third reflector layer 118 being configured in the same way, that is to say being fabricated from the same material as the first and the second reflector layers 105 and 109, and likewise being configured as a DBR reflector layer. This means that the third reflector layer 118 is fabricated from $Al_{0.1}Ga_{0.9}As/Al_{0.4}Ga_{0.6}As$.

The thickness of the third reflector layer is likewise 1 to 2 µm.

A third confinement layer 119 made from gallium arsenide (GaAs) of a thickness of approximately 100 nm is grown on the reflector layer 118.

The so called Stranski-Krastanov method is used to grow a quantum-dot layer 120 on the third confinement layer in such a way that quantum dots 121 are formed in the quantum-dot layer 120.

In accordance with this exemplary embodiment, the quantum-dot layer 120 is fabricated from InAs or (InGa)As, the quantum-dot layer 120 having a thickness of approximately 2–7 nm.

A fourth confinement layer 122, likewise made from GaAs, is grown on the quantum-dot layer 120, that is to say in a way corresponding to the third confinement layer 119.

Finally, a fourth reflector layer 123, which is configured as a DBR reflector layer and thus likewise serves as a Bragg reflector, is grown on the fourth confinement layer 122. The fourth confinement layer 122 is likewise fabricated from $Al_{0.1}Ga_{0.9}As/Al_{0.4}Ga_{0.6}As$.

The thickness of the fourth reflector layer 123 is likewise 1 to 2 µm.

The second electric contact 117 is applied to the fourth reflector layer 123.

Photons which are emitted by the quantum dots 121 are emitted in the direction of the beam profile symbolized by the arrow 104.

The invention results in a round beam profile which is very well suited for launching into an optical conductor.

The excitation ground state of a respective quantum dot 121 in the quantum-dot layer 120 is brought into resonance with a freely prescribable resonator mode of the second resonator 103 by means of the control device 116.

This is performed in concrete terms on the basis of the so called "Quantum Confined Stark Effect" (QCSE), that is to say by applying a variable electric field between the two electric contacts of the photon emitter 100, in accordance with this exemplary embodiment by applying a variable electric voltage between the first electric contact 115 and the second electric contact 117.

It may be pointed out in this connection that, in accordance with this exemplary embodiment, the reflectivity R of the third reflector layer 118 is greater than the reflectivity R of the fourth reflector layer 123.

In addition, a further control unit 125 is connected between electric contact 115 and a further electric contact 124 on the substrate 101, and is used to feed current pulses into the first resonator 102. In this way, the first resonator 102 generates laser pulses which excite the quantum dots 121 in the quantum-dot layer 120 of the second resonator 103.

FIG. 3 shows the principle on which the invention is based in a resonance diagram 300 which illustrates the reflectivity R 302 of the first 102 and the second resonator 103 above an energy axis 301.

Reflection curves 304, 303 of the first 102 and the second resonator 103 are shown. The peak 306 shows the energy of the laser mode of the first resonator, while the peak 305 shows the excitation ground state energy of a quantum dot in the quantum-dot layer 120 of the second resonator 103.

Figure 2:
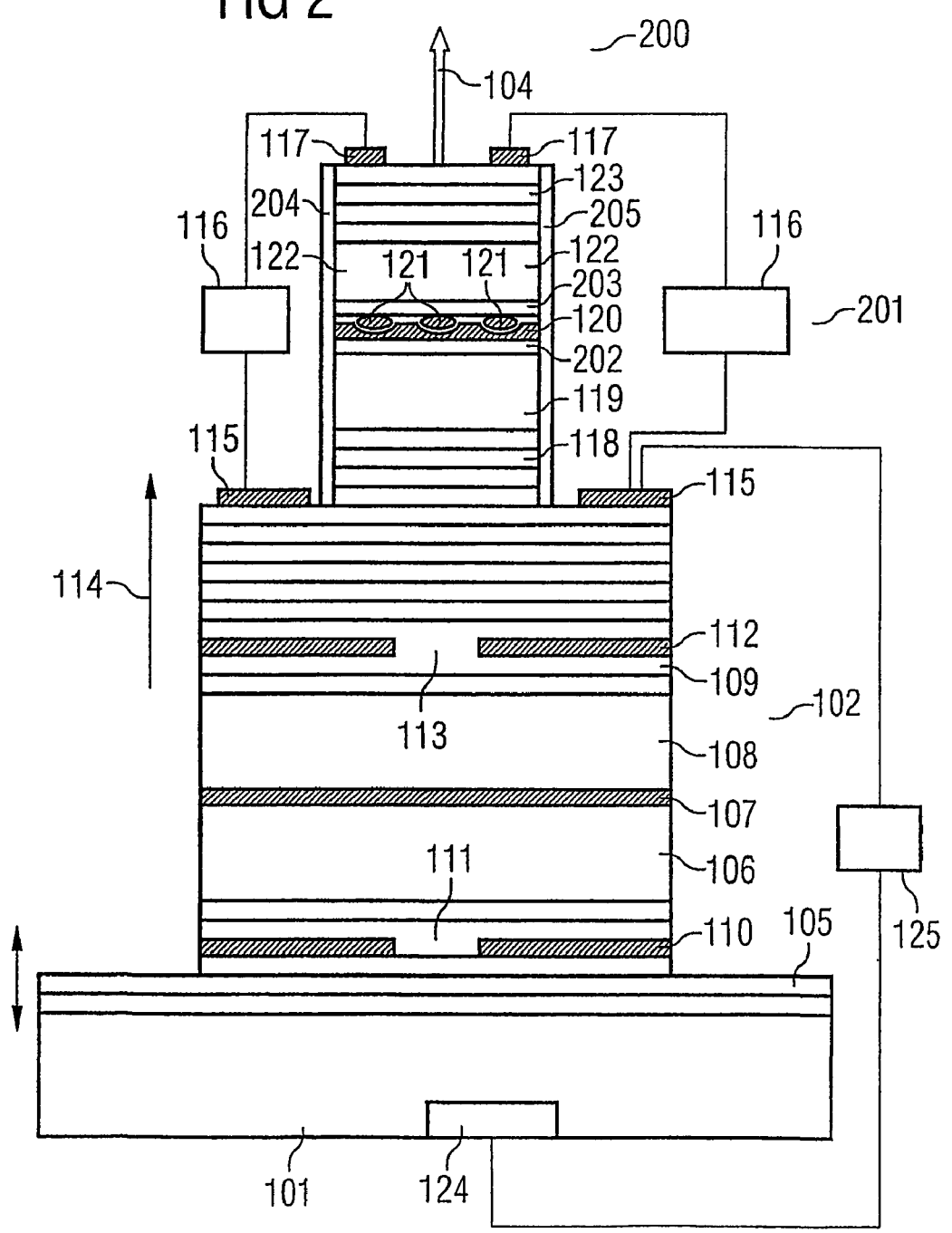
FIG. 2 shows a cross-sectional view of a photon emitter in accordance with a second exemplary embodiment of the invention.

FIG. 2 shows a photon emitter 200 in accordance with a second exemplary embodiment of the invention.

In the case of the photon emitter 200 in accordance with the second exemplary embodiment of the invention, the elements identical to the photon emitter 100 in accordance with the first exemplary embodiment of the invention are provided with identical reference numerals.

The first resonator 102 corresponds to the first resonator 102 of the photon emitter 100 in accordance with the first exemplary embodiment; there is merely a difference between the structure of the second resonator 201 of the photon emitter 200 and the second resonator 103 of the photon emitter 100 in accordance with the first exemplary embodiment.

By contrast with the second resonator 218 in accordance with the first exemplary embodiment of the invention, there is grown from aluminium arsenide on the third confinement layer 119 in accordance with this exemplary embodiment a first tunnel barrier layer 202 with a thickness of from 10 to 20 nm which prevents a tunnel effect of charge carriers from the quantum dots 121 of the quantum-dot layer 120. Likewise, the tunnel effect is prevented by a second tunnel barrier layer 203, likewise made from aluminium arsenide with a thickness of from 10 to 20 nm, applied to the quantum-dot layer 120.

The fourth confinement layer 122 is now grown on the second tunnel barrier layer 203, and the fourth reflector layer 123 is grown on the fourth confinement layer 122.

Furthermore, a reflecting layer 205, in general a silvering, is applied to the side walls 204 of the second resonator 201, the result being a further increase in the efficiency of the second resonator 201.

An estimate of the required areal density $N_Q$ of the quantum dots in the photon emitter is given below such that in statistical terms only one quantum dot is situated spatially and spectrally within the resonator mode $[-2\sigma_C, 2\sigma_C]$.

A Gaussian profile with a spectral shape of the mode and the spectral distribution of the quantum dots with the standard deviations of $\sigma_C$ and $\sigma_E$ is assumed in each case for the estimate.

Moreover, design parameters for the microresonator in accordance with J. M. Gerard et al., Phys. Rev. Lett. 81, 1110, 1998 are used as starting point.

Assumed parameters:
1. Diameter of the second resonator: d=3 μm
2. Quality of the second resonator: Q=5000→line width $\Delta E$=0.26 meV (given 1.305 eV)
3. Emission wavelength: λ=950 nm→E=1.305 eV
4. Effective area of the fundamental mode: $A=\pi d^2/16=1.77$ μm².
5. Half-value width of the quantum dot photoluminescence: 50 meV
6. Line width of the quantum dots is narrower than 0.26 meV. (This is always fulfilled for low temperatures in the InAs/GaAS system ($\Delta E$<0.07 meV)).

The targeted areal density can be estimated using the above parameters with the aid of the standardized shape of the normal distribution.

Result for above parameters:

| $N_Q$ [cm$^{-2}$] | Average number of the quantum dots within the resonator mode $[-2\sigma_C, 2\sigma_C]$ |
|---|---|
| 10$^{11}$ | 14.1 |
| 10$^{10}$ | 1.4 |
| 10$^9$ | 0.14 |
| 7 × 10$^9$ | 1 |

Given an a real density of $N_Q$=7×10⁹ quantum dots/cm², the result is thus statistically one quantum dot within the resonator mode. The accurate resonance condition (exact overlap) can then be produced with the aid of the Quantum Confined Stark Effect.

While the invention has been described in detail with particular reference to certain embodiments thereof, the invention is capable of other and different embodiments, and its details are capable of modifications in various obvious respects. As would be readily apparent to those skilled in the art, variations and modifications can be affected while remaining within the spirit and scope of the invention. Accordingly, the foregoing disclosure, description, and drawing figures are for illustrative purposes only, and do not in any way limit the invention, which is defined only by the claims.

What is claimed is:

1. A single photon emitter comprising:
   a radiation-emitting first resonator;
   a second resonator, which is integrated with the first resonator and has a plurality of quantum dots;
   the second resonator arranged in a direction of emission of radiation emitted by the first resonator, wherein at least one quantum dot of the plurality of quantum dots in the second resonator is excited by energy of the emitted radiation; and
   a control unit coupled to the second resonator to set an excitation ground state of the at least one quantum dot of the plurality of quantum dots in the second resonator;
   wherein the excitation ground state of exactly one quantum dot of the plurality of quantum dots in the second resonator is brought into resonance with a prescribed resonator mode of the second resonator.

2. The single photon emitter according to claim 1, wherein the first resonator is a vertically emitting laser element.

3. The single photon emitter according to claim 1, wherein the control unit applies an electric field to set the excitation ground state of the active quantum dot in the second resonator.

4. The single photon emitter according to claim 1, wherein the first resonator and/or the second resonator is/are configured as DBR resonators.

5. The single photon emitter according to claim 1, wherein the first resonator and/or the second resonator is/are configured as aluminium-gallium-arsenide resonators.

6. The single photon emitter according to claim 1, wherein the first resonator comprises:
   a first reflector layer;
   a first confinement layer applied on the first reflector layer;
   an active layer applied on the first confinement layer;
   a second confinement layer applied to the active layer; and
   a second reflector layer applied on the second confinement layer.

7. The single photon emitter according to claim 6, wherein the first reflector layer, the first confinement layer, the second confinement layer, and the second reflector layer contain aluminium gallium arsenide, and the active layer contains gallium-arsenide.

8. The single photon emitter according to claim 6, wherein the second resonator comprises:
   a third reflector layer;
   a third confinement layer applied on the third reflector layer;
   a quantum-dot layer, applied on the third confinement layer, with the plurality of quantum dots;
   a fourth confinement layer applied on the quantum-dot layer; and
   a fourth reflector layer applied on the fourth confinement layer.

9. The single photon emitter according to claim 8, wherein the third reflector layer, the third confinement layer, the fourth confinement layer, and the fourth reflector layer contain aluminium gallium arsenide, and the quantum-dot layer contains indium arsenide or indium gallium arsenide.

10. The single photon emitter according to claim 8, wherein a tunnel barrier layer are/is provided between the third reflector layer and the quantum-dot layer and/or between the quantum-dot layer and the fourth reflector layer.

11. The single photon emitter according to claim 1, wherein the second resonator comprises:
- a first reflector layer;
- a first confinement layer applied on the first reflector layer;
- a quantum-dot layer, applied on the first confinement layer, with the plurality of quantum dots;
- a second confinement layer applied on the quantum-dot layer; and
- a second reflector layer applied on the second confinement layer.

12. The single photon emitter according to claim 11, wherein the first reflector layer, the first confinement layer, the second confinement layer, and the second reflector layer contain aluminium gallium arsenide, and the quantum-dot layer contains indium arsenide or indium gallium arsenide.

13. The single photon emitter according to claim 11, wherein a tunnel barrier layer are/is provided between the first reflector layer and the quantum-dot layer and/or between the quantum-dot layer and the second reflector layer.

14. The single photon emitter according to claim 1, further comprising at least one optical wing mirror fitted on at least one side wall of the second resonator.

15. A data transmission device having a single photon emitter according to claim 1.

16. A data transmission device having a single photon emitter according to claim 6.

17. A data transmission device having a single photon emitter according to claim 8.

18. A data transmission device having a single photon emitter according to claim 11.

19. A single photon emitter comprising:
- a radiation-emitting first resonator;
- a second resonator, which is integrated with the first resonator and is arranged in a direction of emission of the first resonator, wherein a quantum dot in the second resonator is excited by energy of radiation emitted by the first resonator; and
- a control unit arranged to bring the excitation ground state of the quantum dot into resonance with a prescribed resonator mode of the second resonator.

20. A data transmission device having a single photon emitter according to claim 19.

* * * * *

UNITED STATES PATENT AND TRADEMARK OFFICE
CERTIFICATE OF CORRECTION

PATENT NO. : 7,030,407 B2
APPLICATION NO. : 10/742601
DATED : April 18, 2006
INVENTOR(S) : Peter Michler It is certified that error appears in the above-identified patent and that said Letters Patent is hereby corrected as shown below:

Column 5, line 26: "1m" should be changed to --µm--.

Signed and Sealed this

Thirty-first Day of October, 2006

JON W. DUDAS
*Director of the United States Patent and Trademark Office*